United States Patent [19] [11] 4,158,450
Suzuki [45] Jun. 19, 1979

[54] MOUNTING OF PARTS ON A CHASSIS OR BASE PLATE

[75] Inventor: Yutaka Suzuki, Tokyo, Japan

[73] Assignee: Sony Corporation, Tokyo, Japan

[21] Appl. No.: 814,731

[22] Filed: Jul. 11, 1977

[30] Foreign Application Priority Data

Jul. 30, 1976 [JP] Japan ............................ 51/102871[U]
Aug. 10, 1977 [JP] Japan ............................ 51/112319[U]

[51] Int. Cl.² ............................................ F16M 13/00
[52] U.S. Cl. ..................................... 248/1; 24/221 R; 174/138 D; 264/242; 403/269
[58] Field of Search ................... 248/1, 200; 264/241, 264/242; 403/269; 174/138 D; 24/221 R

[56] References Cited

U.S. PATENT DOCUMENTS

| 2,445,009 | 7/1948 | Strauss et al. ........................ 248/200 |
| 2,705,346 | 4/1955 | Schlabach et al. ............... 264/242 X |
| 3,013,308 | 12/1961 | Armour ............................. 264/242 X |
| 3,358,550 | 12/1967 | Crowther ........................ 264/241 X |
| 3,643,296 | 2/1972 | Kahn ............................. 24/221 R X |
| 3,764,729 | 10/1973 | Kowalewski ..................... 174/138 D |
| 3,800,369 | 4/1974 | Nikolits et al. ..................... 24/221 R |
| 3,990,131 | 11/1976 | Okamura ........................... 24/221 R |

Primary Examiner—William H. Schultz
Attorney, Agent, or Firm—Lewis H. Eslinger; Alvin Sinderbrand

[57] ABSTRACT

In mounting a part or parts, for example, of a tape recorder or other appearance, on a chassis or metal base plate, the metal base plate is provided with a circular hole, and a synthetic resin mounting member is molded through such hole so as to include a support portion molded against one surface of the base plate, a root portion molded against the other surface of the base plate and a connecting portion molded in the circular hole simultaneously with the support and root portions so as to be integral therewith and to permit turning of the mounting member about the axis of its connecting portion between an initial molded position in which all portions of the mounting member are fully located within the perimeter of the base plate and an active position angularly spaced from the initial molded position and in which the support portion of the mounting member is operative to mount a respective part on the base plate. In the active position of the mounting member, the support portion thereof may project substantially beyond the perimeter of the base plate so that the part or parts mounted on such support portion may also project beyond the base plate. Further, a locking arrangement is preferably molded integrally with the mounting member and is operative, upon turning of the latter to its active position, for securing the mounting member at such active position.

27 Claims, 19 Drawing Figures

MOUNTING OF PARTS ON A CHASSIS OR BASE PLATE

BACKGROUND OF THE INVENTION

1. Field of the Invention

This invention relates generally to the mounting of parts, for example, of a tape recorder or other apparatus, on a metal chassis or base plate by means of synthetic resin mounting members molded through holes in the base plate so as to be permanently joined in the latter.

2. Description of the Prior Art

It has been the usual practice to provide small tape recorders or other apparatus with a chassis which is molded of synthetic resin and which has metal pins, shaft bushings and the like inserted and anchored in the chassis during the molding of the latter. In order to provide a molded synthetic resin chassis with the requisite strength and rigidity, the molded chassis must be of substantial thickness, and such requirement interferes with the miniaturizing of the associated apparatus. Further, with the described arrangement employing a synthetic resin chassis with metal pins, shaft bushings and other inserts inserted in the chassis during the molding thereof, considerable difficulty and hence relatively high costs, are involved in positioning the metal inserts for the molding operation and in mounting and securing various separately formed various parts in respect to such metal inserts.

In view of the above problems associated with a chassis molded of synthetic resin and having metal inserts anchored therein, there has been recently adopted a so-called "outsert" system in which the chassis or base of the apparatus is formed of a metal plate and mounting members of synthetic resin are molded through holes in the metal plate so as to define pins, shafts and supporting lugs or posts at one side of the metal plate, for example, as disclosed in U.S. Pat. No. 3,248,867, and in the article entitled "One-shot Plastic-to-Steel Molding Improves Clock Design" beginning at page 91 of MACHINERY, February, 1965. In order to permanently and securely join each of the synthetic resin mounting members to the metal base plate or chassis, each mounting member includes a support portion in the form of the desired pin, shaft, lug or post molded against one surface of the base plate at an area of the latter extending outwardly from the respective hole, a root portion molded against the opposite surface of the base plate at an area of the latter also extending outwardly from the respective hole, and a connecting portion molded in the hole simultaneously with the support and root portions so as to be integral therewith. By reason of the inherent strength of the metal forming the base plate or chassis, the thickness of the latter can be minimized so as to adapt the resulting combination of the chassis or base plate and mounting members for inclusion in a miniaturized apparatus. Since the several mounting members of synthetic resin can be molded simultaneously in respect to the metal base plate or chassis, the combination of the base plate or chassis and the several mounting members can be economically and easily produced.

However, the existing "outsert" system for providing molded mounting members integrated with a metal base plate or chassis has a number of limitations that restrict the use thereof and prevent realization of the maximum economies possible in assembling various parts on the chassis by means of the mounting members. More particularly, when molding the mounting members, the metal chassis or base plate having holes therein is disposed between a pair of dies and melted resin is forced to flow into cavities opening at the faces of the dies at the locations of the holes so as to form the support portions in the form of pins, shafts, lugs or posts in the cavities of one die, while the root portions of the mounting members are formed in the cavities of the other die and connected to the respective support portions through the holes in the metal base plate or chassis. If one or both of the dies is provided with a recess in the face thereof for receiving the metal base plate or chassis with the intention that, during molding, the peripheral portions of the dies will abut each other about the perimeter of the base plate or chassis, variations in the thickness of the metal base plate or chassis which are within accepted manufacturing tolerances may nevertheless result in a gap between the peripheral portions of the dies which are intended to abut or in gaps between the faces of the dies and the confronting surfaces of the metal base plate or chassis so that undesirable flashes of the resin will be formed in such gaps. In order to avoid the formation of the flashes, it is necessary that at least the peripheral portions of the dies abut against the opposite surfaces of the metal base plate or chassis during the molding of the mounting members. By reason of the foregoing, the mounting members, as molded in cavities of the dies, cannot extend beyond the perimeter of the base plate or chassis. Thus, the overall size of the base plate or chassis and the size of the dies required for the molding of mounting members through such base plate are dictated by the sizes and spacing of the parts to be supported or mounted by the mounting members on the base plate or chassis.

Furthermore, with the existing "outsert" system, additional locking or fastening elements are required for securing parts on the molded mounting members. For example, if a slide member is to be mounted for longitudinal movement in respect to the metal base plate or chassis, the respective molded mounting members provided for that purpose usually have their support portions in the form of posts terminating in reduced diameter guide pins which are slidably received in longitudinal slots of the slide member. When assembling the slide member on the molded posts extending from the chassis, it is customary to install E-rings on the reduced diameter ends or guide pins of the posts after the latter have been extended through the slots of the slide member so as to prevent removal of the slide member from such guide pins. The use of such E-rings or other fastenings for securing the slide member or other part on the mounting members increases the number of elements and time required for the assembly.

OBJECTS AND SUMMARY OF THE INVENTION

Accordingly, it is an object of this invention to mount parts, for example, of a tape recorder or other apparatus, on a metal chassis or base plate by means of synthetic resin mounting members which are molded through holes in the base plate so as to be permanently joined thereto, and which are formed so as to facilitate the molding of the mounting members and the mounting of the respective parts thereby.

More particularly, it is an object of the invention to provide synthetic resin mounting members molded through holes in a metal base plate or chassis, as aforesaid, and in which such mounting members are capable of securing the respective parts assembled thereon, that is, preventing the removal of the assembled parts from the respective mounting members, without requiring the use of any separately formed fastenings or the like.

Another object is to provide synthetic resin mounting members molded through holes in a metal base plate or chassis and which, in active positions of such mounting members, are capable of mounting respective parts extending beyond the perimeter of the base plate or chassis so as to permit the reduction of the size of the latter below that which would otherwise be required by the size and spacing of the parts to be supported or mounted thereon.

Still another object is to provide molded mounting members, as aforesaid, for supporting or mounting parts extending beyond the perimeter of the metal base plate or chassis, and in which such mounting members, when molded through holes in the metal base plate or chassis, are fully located within the perimeter of the base plate or chassis so as to permit the molding operation to be performed with relatively small dies which, at their peripheral portions, abut against the opposite surfaces of the metal base plate or chassis for preventing the formation of flashes of the resin even though the thickness of the metal forming the base plate or chassis may vary from one base plate or chassis to the other.

A further object of the invention is to provide a metal base plate or chassis with synthetic resin mounting members molded through respective holes in the base plate or chassis, and in which at least one of the mounting members is turnable relative to the base plate or chassis from an initial molded position to an active position angularly spaced from such initial position and at which the turned mounting member is operative to mount a respective part on the base plate or chassis.

A still further object is to provide each turnable synthetic resin mounting member with locking means molded integrally therewith and being operative, upon turning of the mounting member to its active position, for securing the mounting member against further turning either beyond its active position or back toward its initial molded position.

Yet another object of the invention is to include in the above mentioned locking means for preventing angular displacement of the turnable mounting member from its active position a locking element constituted by a runner molded against a surface of the metal base plate or chassis between, and integral with a fixed molded mounting member and the turnable mounting member, with such runner being joined to the turnable mounting member by a narrowed end portion which is frangible or separable in response to displacement of the turnable mounting member from its initial molded position to its active position at which the separated end portion of the runner or locking element engages in a recess or keeper molded in the turnable mounting member for securing the latter at its active position.

In accordance with an aspect of this invention, a synthetic resin mounting member is molded through a circular hole in a metal base plate so as to include a support portion molded against one surface of the base plate at an area of the latter extending outwardly from the hole, a root portion molded against the opposite surface of the base plate at an area of the latter also extending outwardly from the hole and a connecting portion molded in the circular hole simultaneously with the support and root portions so as to be integral therewith and to have a circular cross-section for permitting turning of the mounting member relative to the metal base plate about the axis of the connecting portion between an initial molded position at which the mounting member is entirely located within the perimeter of the base plate, and an active position angularly spaced from the initial position and at which the support portion is operative to mount a respective part in respect to the base plate, for example, to prevent removal of the part from the base plate or to support the part with at least a portion of the latter extending beyond the perimeter of the base plate.

The above, and other objects, features and advantages of the invention, will be apparent from the following detailed description of illustrative embodiments thereof which is to be read in connection with the accompanying drawings.

DESCRIPTION OF THE PREFERRED EMBODIMENTS

Figure 1:
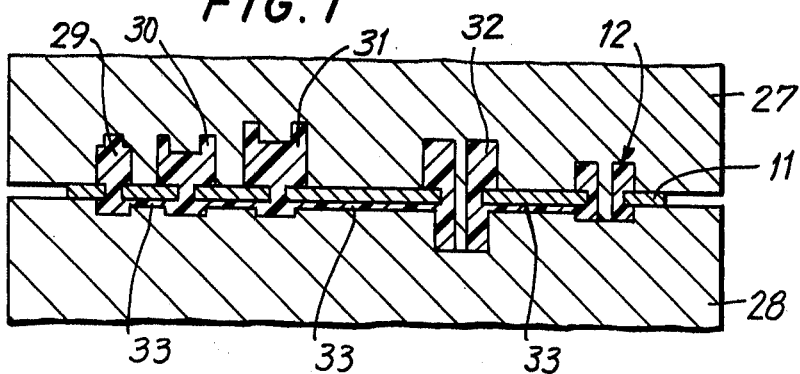
FIG. 1 is a vertical sectional view showing a pair of dies engaging the opposite surfaces of a metal base plate or chassis and provided with cavities for molding synthetic resin mounting members through holes in the base plate or chassis in accordance with an embodiment of this invention.

Referring initially to FIGS. 1-5, it will be seen that the present invention is there illustrated as being specifically applied to the mounting of a counter 10 (FIGS. 4 and 5) of a tape recorder or other apparatus on a metal chassis or base plate 11 of such apparatus.

As shown, the mounting of counter 10 on metal chassis 11 is effected by means of a respective mounting member 12 molded of a suitable synthetic resin, for example, the resin available commercially under the tradename "Duracon" and which is a type of acetal resin constituted by a copolymer of formaldehyde and ethylene oxide. In accordance with this invention, the synthetic resin mounting member 12 is molded through a circular hole 13 (FIGS. 3 and 5) provided in chassis 11 and being spaced inwardly from an adjacent edge portion 11a of the perimeter of chassis 11. As hereinafter described in detail, the mounting member 12 is molded to include a support portion 14 molded against one surface of the base plate or chassis 11 at an area of the latter extending or radiating outwardly from hole 13, a root portion 15 molded against the opposite surface of chassis 11 at an area of the latter also extending or radiating outwardly from hole 13, and a connecting portion 16 molded in the circular hole 13 simultaneously with the support and root portions 14 and 15 so as to be integral therewith and to have a circular cross-section. By reason of such circular cross-section of connecting portion 16, mounting member 12 is turnable relative to the metal base plate or chassis 11 about the axis of connecting portion 16 between an initial molded position shown in full lines on FIG. 2 and an active position angularly spaced from the initial molded position, as indicated in broken lines at 12' on FIG. 2.

Figure 2:
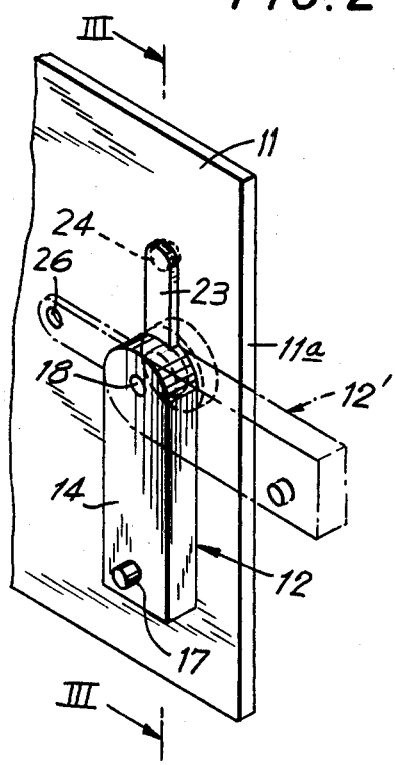
FIG. 2 is a fragmentary perspective view illustrating one of the synthetic resin mounting members molded through the base plate by means of the dies depicted on FIG. 1, and which is turnable in accordance with this invention between an initial molded position shown in full lines and an active position shown in broken lines.
Figure 3:
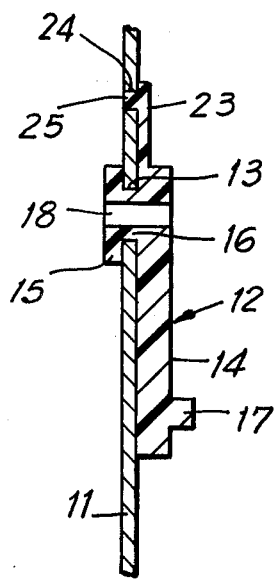
FIG. 3 is a detail sectional view taken along the line III—III on FIG. 2.
Figure 4:
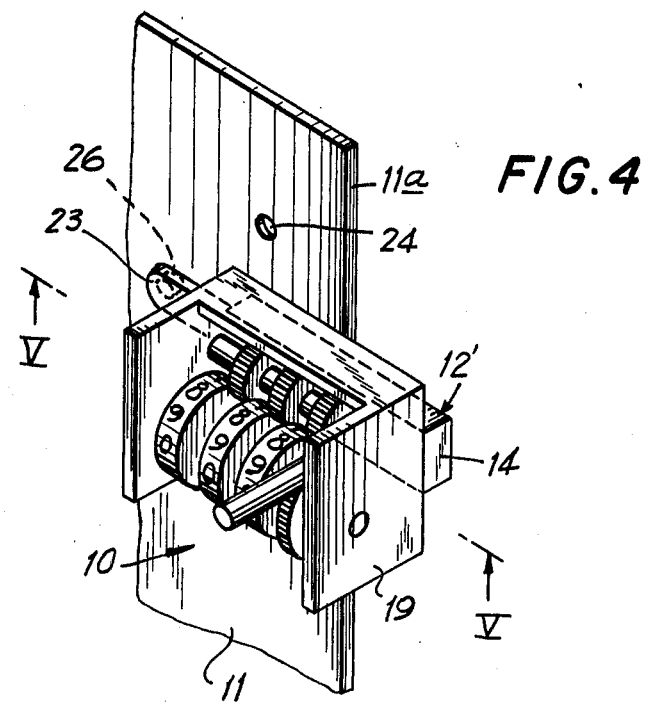
FIG. 4 is a perspective view similar to that of FIG. 2, but showing the manner in which the illustrated mounting member according to this invention, when in its active position, may mount a respective part, shown in the form of a counter, on the base plate or chassis with at least portions of the mounting member and the part mounted thereon projecting beyond the perimeter of the base plate.
Figure 5:
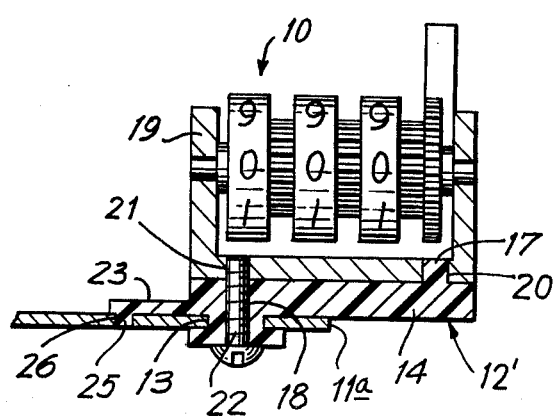
FIG. 5 is a sectional view taken along the line V—V on FIG. 4.

As is apparent on FIG. 2, the configuration of the mounting member 12 according to this invention is selected so that all portions thereof are fully located within the perimeter of the base plate or chassis 11 at least when mounting member 12 is disposed in its initial molded position. In the embodiment of the invention presently being described, the support portion 14 of mounting member 12 is substantially in the form of an elongated support arm which, in the initial molded position of member 12, extends from connecting portion 16 substantially parallel to the adjacent edge portion 11a of the chassis perimeter. Further, the arm constituting support portion 14 is longitudinally dimensioned so that, when mounting member 12 is turned from its initial molded position to its active position indicated at 12' on FIGS. 2,4 and 5, support arm 14 projects substantially beyond edge portion 11a of the perimeter of chassis 11. Support arm 14 of member 12 is further shown to be molded with a locating pin 17 (FIGS. 2,3 and 5) projecting in the direction away from chassis 11 from the end portion of arm 14 which is remote from connecting portion 16, and connecting portion 16 is molded with a bore 18 extending axially therethrough and opening at the surfaces of support arm 14 and root portion 15 facing away from chassis 11.

The counter 10 or other device adapted to be mounted on chassis 11 by means of mounting member 12 is shown to have a frame 19 (FIG. 5) formed, in its base, with a hole 20 dimensioned to receive locating pin 17 of support arm 14 and with a tapped or threaded bore 21 spaced from hole 20 so as to register with bore 18 of mounting member 12 when locating pin 17 is received in hole 20. In employing mounting member 12 for mounting counter 10 or some other similar device on chassis 11, mounting member 12 is turned to its active position indicated at 12' following the molding of mounting member 12 in its initial molded position shown in full lines on FIG. 2. With the mounting member disposed in its active position, the frame 19 of counter 10 is simply disposed on support arm 14 so as to receive locating pin 17 of the latter in hole 20 and to register tapped or threaded bore 21 with bore 18. Then, a screw 22 is simply extended through bore 18 and threadably engaged in tapped bore 21 for securing counter 10 to molded mounting member 12.

Further, in accordance with this invention, mounting member 12 is preferably provided with locking means molded integrally therewith and being operative, upon turning of the mounting member to its active position indicated at 12', to secure the mounting member in its active position against further turning either in the direction further away from the initial molded position or in the direction back toward the latter. In the embodiment being described, such locking means is shown to include an arm portion 23 molded integrally with support portion or arm 14 and extending radially in respect to the turning axis of mounting member 12 in the direction diametrically opposed to support arm 14. In the initial molded position of support member 12, locking arm portion 23 extends over a first aperture 24 in chassis 11 so that a projection 25 is molded integrally with locking arm portion 23 in aperture 24. Further, locking arm portion 23 has a relatively small thickness, as shown on FIG. 3, so as to be resiliently flexible away from chassis 11 for removing projection 25 from aperture 24 and thereby freeing mounting member 12 for turning from its initial molded position to its active position. When the mounting member is turned to its active position indicated at 12' on FIG. 2, projection 25 of locking arm portion 23 is received in a second aperture 26 of chassis 11 which is spaced suitably from first aperture 24 and is at the same radial distance from the turning axis of support member 12 as aperture 24. It will be apparent that, upon reception of projection 25 in aperture 26, as on FIGS. 4 and 5, molded mounting member 12 is securely locked thereby in its active position 12'.

Since mounting member 12, when in its active position indicated at 12', projects substantially beyond edge portion 11a of the perimeter of chassis 11, the size of chassis 11 can be relatively smaller than the area that has to be occupied by counter 10 and various other parts of a tape recorder or other apparatus by reason of the sizes and the required spacing between such parts when mounted on chassis 11. In thus relatively reducing the required size of chassis 11, the present invention makes it possible to employ relatively small dies 27 and 28 (FIG. 1) for molding mounting member 12 and other mounting members, for example, as indicated at 29-32, through respective holes provided in chassis 11 at locations suitably distributed over the latter.

The additional mounting members 29-32 may be molded so as to be turnable in the respective holes of chassis 11 and also provided with locking means for securing such additional mounting members in their respective active positions in a manner similar to mounting member 12 according to this invention, or any of such additional mounting members 29-32 may be molded so as to be fixed in the respective holes of chassis 11, for example, by providing such holes with non-circular cross-sections or by molding the mounting member through two spaced apart holes in the chassis. Moreover, the additional mounting members may define pins, supporting guides, or bushings, as in the case of the mounting members indicated at 29, at 30 and 31, and at 32, respectively. In all cases, each of the mounting members 12 and 29-32 is molded to include a support portion defined by a respective cavity in die 27 to define the respective support arm, pin, support guide or bushing, a root portion molded in a respective cavity in die 28 and a connecting portion molded in the respective hole or holes of chassis 11 simultaneously with the support and root portion so as to be integral therewith. In order to facilitate the "one-shot" molding of all of the mounting members 12 and 29-32, die 28 may be further formed with channels connecting the cavities thereof which define the root portions of the several mounting members so that, upon molding of the mounting members, the molten resin travels through the channels from one mold cavity to the next, and elongated strips or runner 33 of synthetic resin are molded against the undersurface of chassis 11 and are connected, at their opposite ends, to root portions of respective mounting members. In each case where an end of a runner 33 is integrally joined to the root portion of a mounting member, for example, the mounting member 12, which is to be turnable in the respective hole of chassis 11, the respective channel of die 28 for molding such runner is shaped to provide the latter with a narrowed end portion at its connection to the root portion of member 12. Such narrowed end portion of the runner is frangible to permit turning of the respective mounting member 12 from its initial molded position to its active position.

It is further to be noted that, since all portions of all of the mounting members 12 and 29-32 are fully located within the perimeter of chassis 11, at least in the initial molded positions of those mounting members which are intended to be turnable, the relatively small dies 27 and 28 employed for simultaneously molding all of the mounting members through each chassis 11 can have their peripheral portions abutting against the opposite surfaces of chassis 11, as shown on FIG. 1, for preventing formation of flashes of the resin even though the thickness of the metal constituting chassis 11 may vary from one chassis to the next.

Referring now to FIGS. 6-11, it will be seen that the present invention may also be applied to the mounting on chassis 11 of a part which, in its assembled condition, is to be movable relative to the chassis. For example, as shown, such movable part may be an elongated slide member 34 having a push-button 35 at one end which is actuable for selecting an operating mode or other condition of a tape recorder or the like.

In order to mount slide member 34 on chassis 11 in accordance with this invention, synthetic resin mounting members 36 and 37 (FIG. 6) are molded through respective spaced apart holes in the chassis. More particularly, as shown on FIG. 7, mounting member 36 includes a support portion 38 of laterally elongated bar-like configuration molded against the upper surface of the chassis 11 over a plurality of spaced apart holes 39 in the chassis, a plurality of root portions 40 each molded against the lower surface of chassis 11 at an area of the latter extending or radiating outwardly from a respective one of the holes 39, and connecting portions 41 molded in the holes 39 simultaneously with support and root portions 38 and 40 so as to be integral therewith and thereby fix support portion 38 relative to chassis 11. Support portion 38 of mounting member 36 is formed with an upstanding projection 42 to define a guide lug, and the top of support portion 38 defines a bearing surface 43 at opposite sides of guide lug 42. Further, support portion 38 is molded, at one end, with a reverted extension 44 (FIG. 9) defining an inwardly opening slot 45, and the bottom of reverted extension 44 is spaced slightly from chassis 11 for a purpose hereinafter indicated in detail. A leaf spring 46 has one end portion thereof received in slot 45 and formed with a laterally directed flange 47 which engages between the bottom of reverted extension 44 and the upper surface of chassis 11 for preventing upward removal of spring 46 from slot 45. The free end portion of leaf spring 46 is formed with an upward extension 48 which is substantially aligned with guide lug 42, and a downwardly inclined tongue or tab 49 is struck from extension 48 in the direction toward guide lug 42.

Figure 6:
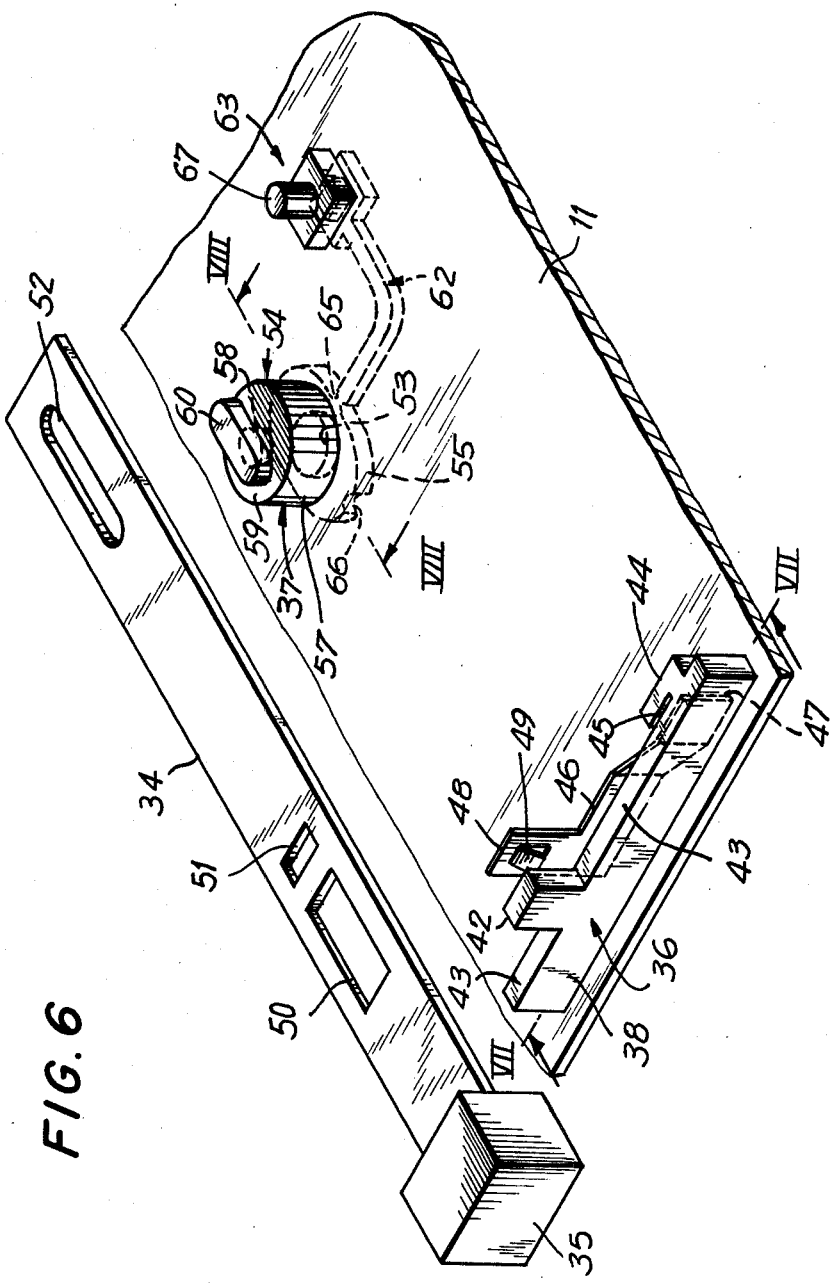
FIG. 6 is an exploded perspective view illustrating another embodiment of this invention in which mounting members molded through holes in a metal base plate or chassis are adapted for movably mounting a slide member on such base plate or chassis.
Figure 7:
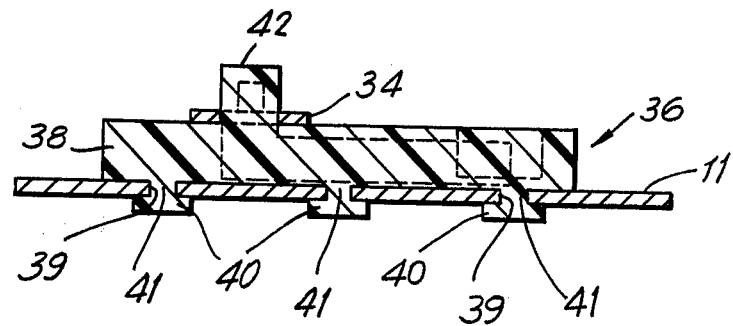
FIG. 7 is a sectional view taken along the line VII—VII on FIG. 6, but showing the slide member disposed on one of the mounting members provided therefor.
Figure 8:
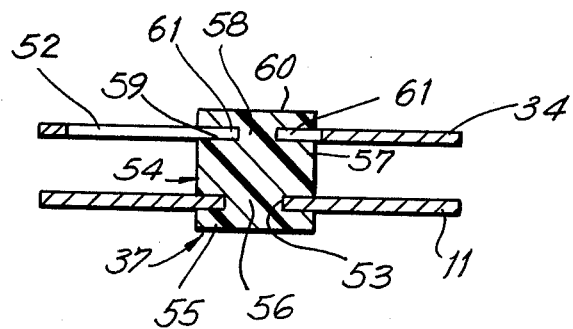
FIG. 8 is a sectional view taken along the line VIII—VIII on FIG. 6, but showing the slide member disposed on another of the mounting members provided therefor and which is illustrated in its initial molded position.
Figure 9:
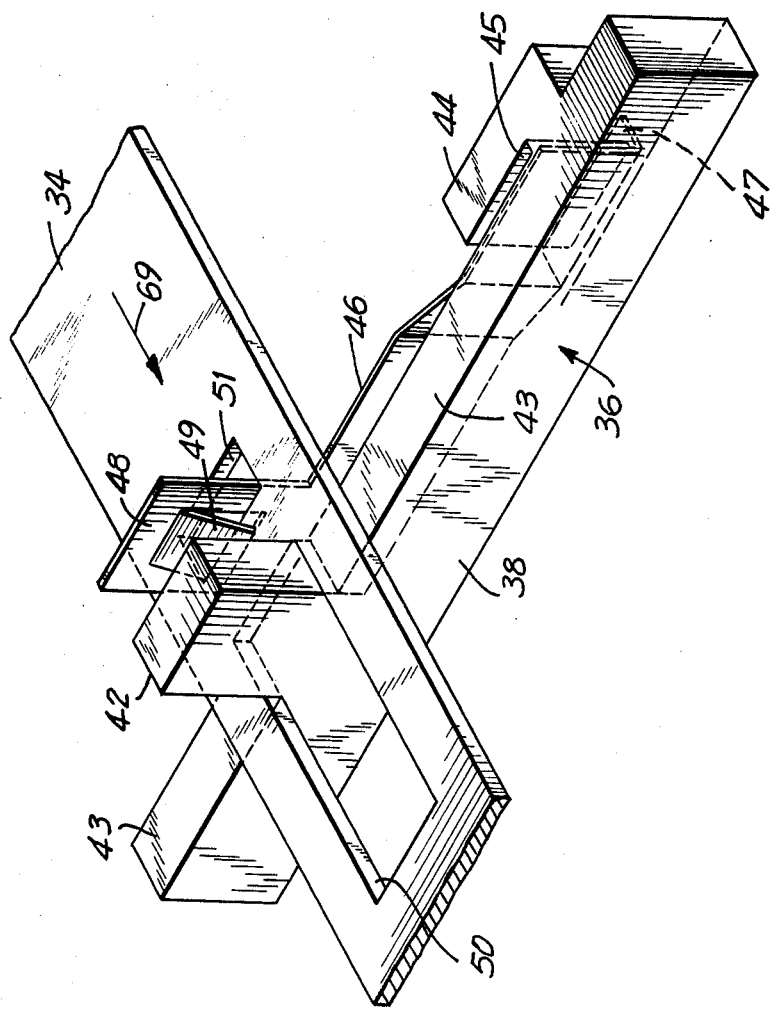
FIG. 9 is an enlarged perspective view of one of the molded mounting members appearing on FIG. 6, but illustrating such mounting member engaged by the slide member.

As shown particularly on FIGS. 6 and 9, slide member 34 has a longitudinal slot 50 formed therein which is laterally dimensioned to receive guide lug 42, and an aperture 51 is also formed in slide member 34 adjacent one end of slot 50 for receiving upward extension 48 of leaf spring 46. Slide member 34 further has a longitudinal slot 52 (FIG. 6) formed therein at a substantial distance from slot 50 for cooperation with mounting member 37.

In accordance with the present invention, mounting member 37 is molded through a circular hole 53 (FIGS. 6, 8 and 11) in chassis 11 and includes a support portion 54 molded against the upper surface of chassis 11 at an area of the latter extending or radiating outwardly from hole 53, a root portion 55 molded against the lower surface of chassis 11 at an area of the latter also extending or radiating outwardly from hole 53, and a connecting portion 56 (FIG. 8) molded in circular hole 53 simultaneously with support and root portions 54 and 55 so as to be integral therewith and to have a circular cross-section. By reason of such circular cross-section of connecting portion 56, mounting member 37 is turnable relative to chassis 11 about the axis of connecting portion 56 between an initial molded position shown on FIG. 6 and in full lines on FIGS. 10 and 11 and an active position angularly spaced by about 90° from the initial molded position, as indicated in broken lines at 37' on FIGS. 10 and 11.

In the embodiment of the invention presently being described, support portion 54 of mounting member 37 is shown to include a generally cylindrical body 57 having a central guide pin 58 projecting from its top and being diametrically dimensioned so as to be slidably receivable in longitudinal slot 52 of slide member 34 while the top surface of body 57 around pin 58 defines a bearing surface 59 for supporting slide member 34. Support portion 54 of mounting member 37 is further shown to include an enlarged or oblong head 60 at the top of pin 58 forming a pair of oppositely directed lateral extensions which are separated from bearing surface 59 by respective undercuts 61 (FIG. 8) of sufficient height to receive the thickness of slide member 34. In the initial molded position of mounting member 37 (FIG. 6) the longitudinal or major axis of oblong head 60 extends in the direction toward guide lug 42 of mounting member 36 so as to be aligned with the longitudinal axis of slide member 34 during the assembling of the latter on mounting members 36 and 37. Further, the distance across head 60 is no greater than the diameter of pin 58 so that, in the initial molded position of mounting member 37, oblong head 60 can pass upwardly through slot 52 of slide member 34.

The mounting member 37 in accordance with this invention is further provided with locking means molded integrally therewith and being operative, upon turning of mounting member 37 to its active position, to secure the mounting member 37 in such active position against turning either in the direction further away from the initial molded position or in the direction back toward the latter. In the embodiment of the invention being presently described, such locking means is shown to include a synthetic resin elongated locking element 62 molded against the undersurface of chassis 11 (FIGS. 6 and 11) and being integrally joined, at one end, to an anchoring portion 63 molded through a preferably non-circular hole 64 formed in chassis 11 at a distance from circular hole 53. The other end of elongated locking element 62 is shown to be integrally joined to the periphery of root portion 55 of mounting member 37 by a narrowed end portion 65 which is frangible or breakable in response to turning of mounting member 37 from its initial molded position. Further, as shown, root portion 55 of mounting member 37 is non-circular, for example, elliptical, and narrowed end portion 65 of locking element 62 is joined to the periphery of elliptical root portion 55 at one end of the minor axis of the latter, while a recess 66 is formed in the periphery of elliptical root portion 55 at an end of the major axis of the latter. Thus, the radial distance from the turning axis of mounting member 37 to the recess 66 is substantially greater than the radial distance from such axis to the location on the periphery of root portion 55 at which narrowed end portion 65 of the locking element is joined thereto in the initial molded position of mounting member 37.

As is particularly apparent on FIG. 6, the anchoring portion 63 may be constituted by another synthetic resin mounting member molded simultaneously with the mounting members 36 and 37 and also including a support portion 67 molded against the upper surface of chassis 11, for example, in the form of a pin, for mounting a respective part, not shown, thereon, a root portion 68 molded against the undersurface of chassis 11 and to which locking element 62 is integrally joined and a connecting portion molded in the rectangular or other non-circular hole 64 and being integral with the support and root portions 67 and 68. The elongated locking element 62 is preferably constituted by a runner, similar to one of the runners 33 referred to above with reference to FIG. 1, and which connects the root portions of mounting members 37 and 63, respectively, when the latter are simultaneously molded. Furthermore, as shown particularly on FIG. 11, the elongated locking element or runner 62 preferably has a longitudinally bent configuration to define angularly related arms 62a and 62b extending from root portions 55 and 68, respectively, with the longitudinal axis of arm 62a being directed so as to substantially pass through the axis of turning of mounting member 37.

In employing mounting members 36 and 37 for mounting slide member 34 on chassis 11, slide member 34 is initially disposed on bearing surfaces 43 and 59 of guide members 36 and 37 with the latter being in its initial molded position shown on FIG. 6 so that guide lug 42 on mounting member 36 is received in slot 50, and guide pin 58 of mounting member 37 is received in slot 52. During such dispostion of slide member 34 on bearing surfaces 43 and 59, extension 48 of spring 46 projects upwardly through aperture 51 and struck out tongue or tab 49 engages over the upper surface of slide member 34. As shown particularly on FIG. 9, leaf spring 46 is shaped, and the distance between slot 50 and aperture 51 is selected so that, with spring extension 48 engaged in aperture 51, spring 46 urges slide member 34 forwardly, that is, in the direction of arrow 69, so that the end of slot 50 adjacent aperture 51 bears against guide lug 42 and the lower or free edge of struck out tab 49 overhangs the upper surface of slide member 34 for preventing the upward removal of the latter from guide lug 42. Of course, if after the assembly of slide member 34 it is desired to remove the same from its engagement with guide lug 42, spring extension 48 can be manually displaced in the direction away from guide lug 42 so as to permit the downward passage of struck-out tab 49 through aperture 51.

Figure 10:
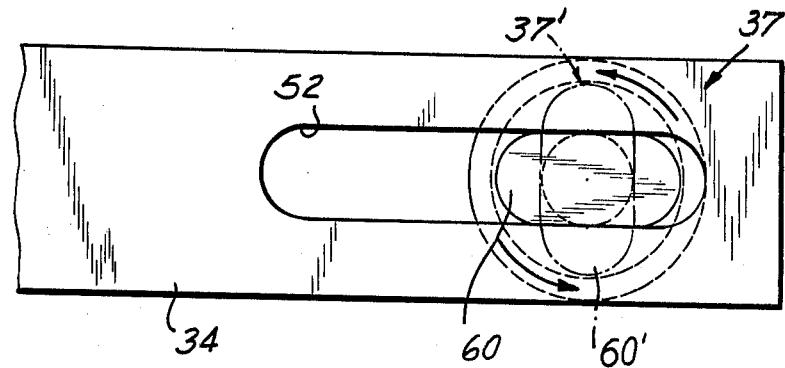
FIG. 10 is an enlarged top plan view of the mounting member appearing on FIG. 8, and which is shown in full lines in its initial molded position and in broken lines in its active position for preventing removal of the slide member from the mounting members supporting the same.
Figure 11:
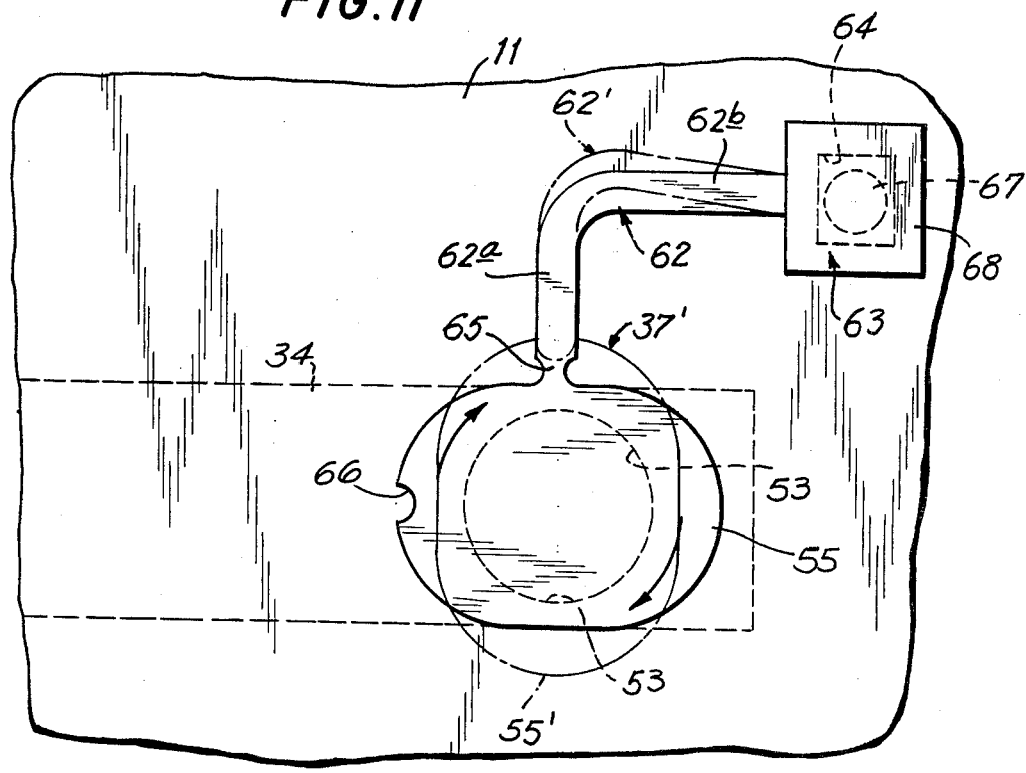
FIG. 11 is a bottom plan view of the mounting member shown on FIG. 10 and of an associated locking means, with such mounting member and associated locking means being shown in full lines and in broken lines for illustrating the initial molded position and the active position, respectively, thereof.

After pin 58 of mounting member 37 has been received in slot 52 of slide member 34, mounting member 37 is turned through approximately 90° from its initial molded position to its active position indicated in broken lines at 37' on FIGS. 10 and 11. As a result of such turning of mounting member 37, its oblong head 60 is displaced to the position indicated in broken lines at 60' on FIG. 10 and thereby extends laterally across slot 52 with the result that the ears or lateral extensions defined by the opposite end portions of head 60' engage over the upper surface of slide member 34 for preventing upward separation of the latter from bearing surface 59.

Further, in response to the turning of mounting member 37 from its initial molded position toward its active position, the frangible, narrowed end portion 65 of elongated locking element 62 breaks away from root portion 55. Alternatively, the narrowed end portion 65 of elongated locking element 62 may be cut through before mounting member 37 is turned from its initial molded position. In either case, the end of locking element 62 which has been separated from root portion 55 rides against the periphery of the latter during turning of the mounting member 37 toward its active position. Due to the elliptical configuration of the periphery of root portion 55 and the fact that the anchoring portion or mounting member 63 is non-turnable in its respective hole 64, locking element 62 is flexed, for example, to the position shown in broken lines at 62' on FIG. 11, in response to turning of member 37 and provides an elastic or resilient force urging the free end of locking element 62 against the periphery of root portion 55. Thus, when mounting member 37 arrives at its active position with root portion 55 then disposed in the position indicated in broken lines at 55' on FIG. 11 so as to locate recess 66 for reception of the free end of locking element 62, the elastic or resilient force generated in locking element 62 by the flexing of the latter strongly urges the free end of locking element 62 into recess 66. Accordingly, mounting member 37 is secured in its active position, that is, the engagement of the free end of locking element 62 in recess 66 prevents further turning of mounting member 37 either in the direction away from the initial molded position or in the direction back toward the latter. By reason of the foregoing, there is no chance that either vibration or shock will displace mounting member 37 from its active position in which the oblong head 60 thereof extends laterally in respect to slot 52 of slide member 34 for maintaining the latter in engagement with bearing surface 59 on mounting member 37.

Figure 12:
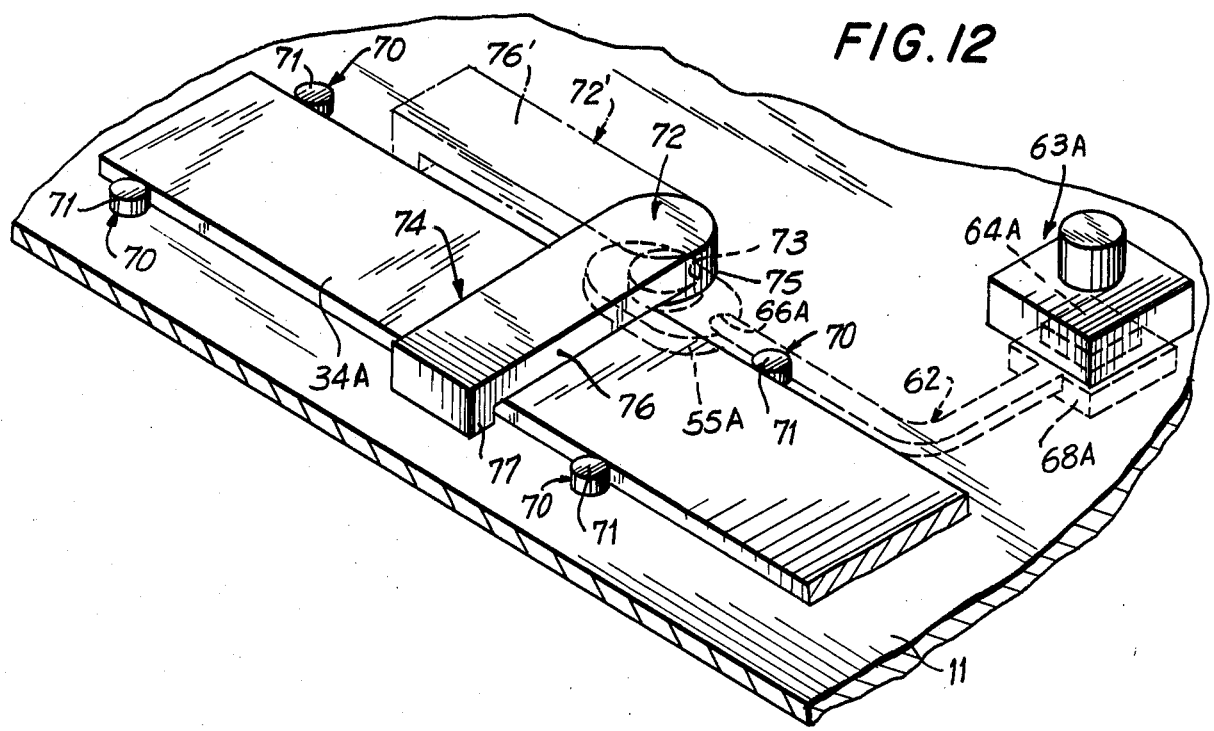
FIG. 12 is a perspective view of another arrangement of molded mounting members for mounting a longitudinally movable slide member on a metal base plate or chassis, with one of the molded mounting members being turnable in respect to the base plate and provided with locking means in accordance with this invention and being shown in full lines in its active position and in broken lines in its initial molded position.
Figure 13:
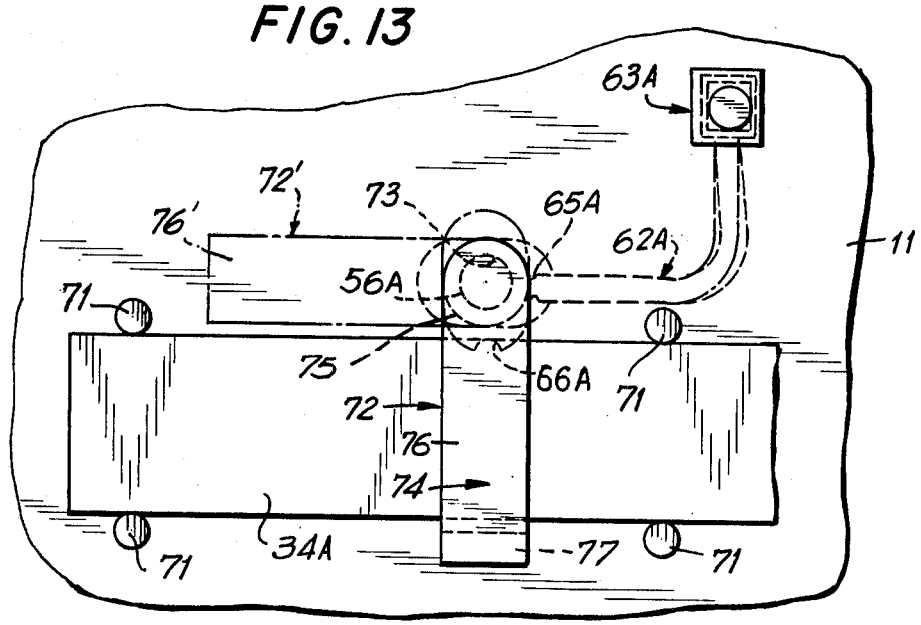
FIG. 13 is a top plan view of the arrangement shown on FIG. 12.

Referring now to FIGS. 12 and 13, it will be seen that, in accordance with another embodiment of this invention, a slide member 34A is guided on chassis 11 for longitudinal sliding movement in respect to the latter by means of four mounting members 70. Such mounting members 70 are molded through respective holes in chassis 11 so as to have support portions in the form of guide pins 71 molded against the upper surface of the chassis and being arranged in pairs at opposite sides of the desired path of travel of slide member 34A for laterally guiding the latter. Further, in accordance with this invention, a mounting member 72 is molded through a circular hole 73 provided in chassis 11 at one side of the desired path of travel of slide member 34A. Mounting member 72 is shown to include a support portion 74 comprised of a generally cylindrical body 75 molded against the upper surface of chassis 11 at an area of the latter extending or radiating outwardly from hole 73, and a lateral extension in the form of an elongated arm 76 extending radially from body 75. It will be seen that arm 76 is spaced upwardly from the upper surface of chassis 11 for a major portion of its length by a distance approximately equal to the thickness of slide member 34A. Further, the free end portion of arm 76 is spaced from body 75 by a distance at least equal to the width of slide member 34A and such free end portion of arm 76 is molded against the upper surface of chassis 11 so as to define a down-turned lug 77. Between body 75 and lug 77, the thickness of arm 76 is dimensioned so that such arm can be resiliently flexed in the direction away from chassis 11. Further, mounting member 72 according to this invention is shown to include a root portion 55A molded against the lower surface of chassis 11 at an area of the latter extending or radiating outwardly from hole 73, and a connecting portion 56A molded in circular hole 73 simultaneously with the support and root portions so as to be integral therewith and to have a circular cross-section. By reason of such circular cross-section of connecting portions 56A, mounting member 72 is turnable relative to chassis 11 about the axis of connecting portion 56A between an initial molded position indicated in broken lines at 72' on FIGS. 12 and 13 and an active position shown in full lines and being angularly spaced by about 90° from the initial molded position.

The mounting member 72 according to this invention is further preferably provided with locking means molded integrally therewith and being operative, upon turning of mounting member 72 to its active position, to secure the mounting member 72 in such active position against turning therefrom in either direction. As shown, the locking means associated with mounting member 72 is substantially the same as that described above in association with mounting member 37 of FIGS. 6–11, and has its corresponding parts identified by the same reference numerals but with the letter "A" appended thereto. Thus, the locking means associated with mounting member 72 is shown to include a synthetic resin elongated locking element 62A molded, for example, as a runner, against the undersurface of chassis 11 and being integrally joined, at one end, to the root portion 68A of another mounting member 36A which is molded through a rectangular hole 64A in chassis 11 so as to be non-turnable in respect to the latter. The other end of elongated locking element 62A is shown to be integrally joined to the elliptical periphery of root portion 55A of mounting member 72 by a narrowed end portion 65A (FIG. 13) which is frangible or breakable in response to turning of mounting member 72 from its initial molded position. Further, a recess 66A is formed in the elliptical periphery of root portion 55A at the end of the major axis of such elliptical periphery.

It will be apparent that, in the initial molded position of mounting member 72, arm 76 thereof extends generally parallel to the path of travel of slide member 34A at one side of such path as indicated in broken lines at 76' on FIGS. 12 and 13, so as to avoid interference with the placement of slide member 34A between guide pins 71. After slide member 34A has been placed between guide pins 71, arm 76 may be flexed upwardly away from chassis 11 so as to permit lug 77 at the free end of arm 76 to clear slide member 34A during turning of mounting member 72 from its initial molded position to its active position. Upon such turning of mounting member 72, narrowed end portion 65A of locking element 62A breaks away from the periphery of root portion 55A and is strongly engaged in recess 66A upon arrival of mounting member 72 in its active position. Thus, mounting member 72 is securely held in its active position against turning therefrom in either direction. In the active position of mounting member 72, arm 76 thereof extends laterally across slide member 34A between body 75 and lug 77 and thus prevents removal of slide member 34A from its guided position between pins 71.

Figure 15:
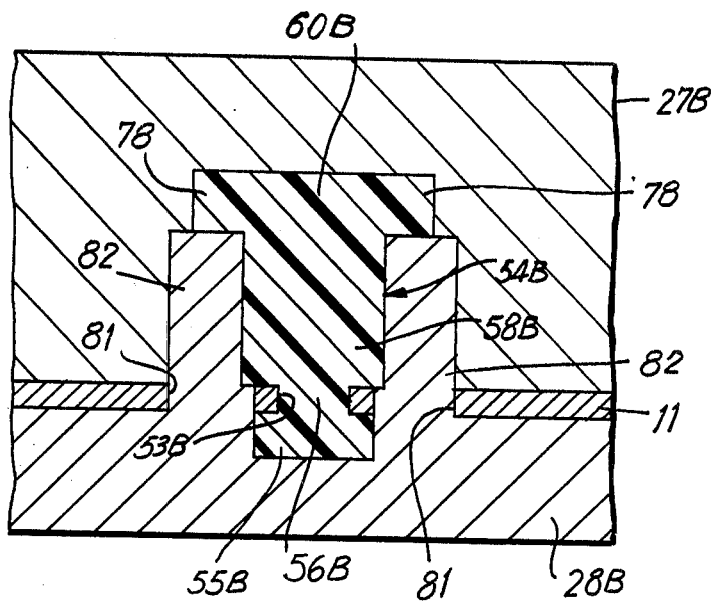
FIG. 15 is a vertical sectional view illustrating a pair of dies by which the mounting member of FIG. 14 is conveniently molded through the base plate positioned between the dies.

Referring back to FIGS. 6 and 8, it will be apparent that, by reason of the undercuts 61 which open laterally outward between the end portions of oblong head 60 and bearing surface 59 at the top of body 57, the support portion 54 of mounting member 37 has to be molded by a split die so as to permit the removal of support portion 54 therefrom after completion of the molding operation. However, reference to FIGS. 14-19 will show that a mounting member 37B according to this invention and intended for a purpose similar to that previously described in respect to mounting member 37 may be shaped so as to permit the molding thereof by one-piece dies 27B and 28B (FIG. 15). To the extent that mounting member 37B is generally similar to the previously described mounting member 37, parts of member 37B functionally corresponding to those of member 37 are identified by the same reference numerals but with the letter "B" appended thereto.

Figure 14:
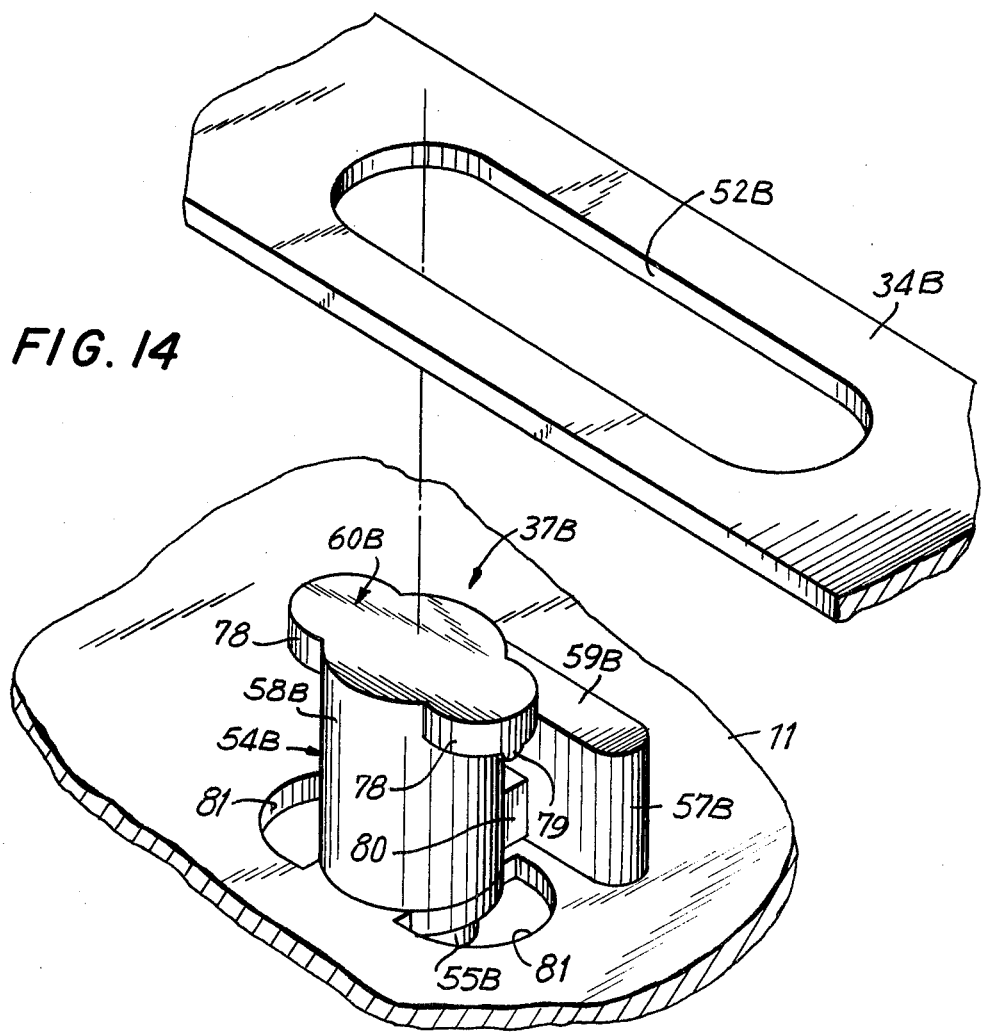
FIG. 14 is an exploded perspective view showing a mounting member molded through a metal base plate or chassis for mounting a longitudinally movable slide member on the base plate in accordance with still another embodiment of this invention.
Figure 16:
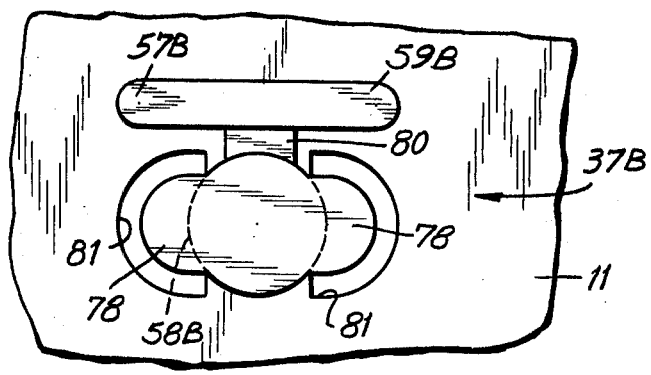
FIG. 16 is a top plan view of the mounting member shown on FIG. 14, and which is illustrated in its initial molded position.
Figure 17:
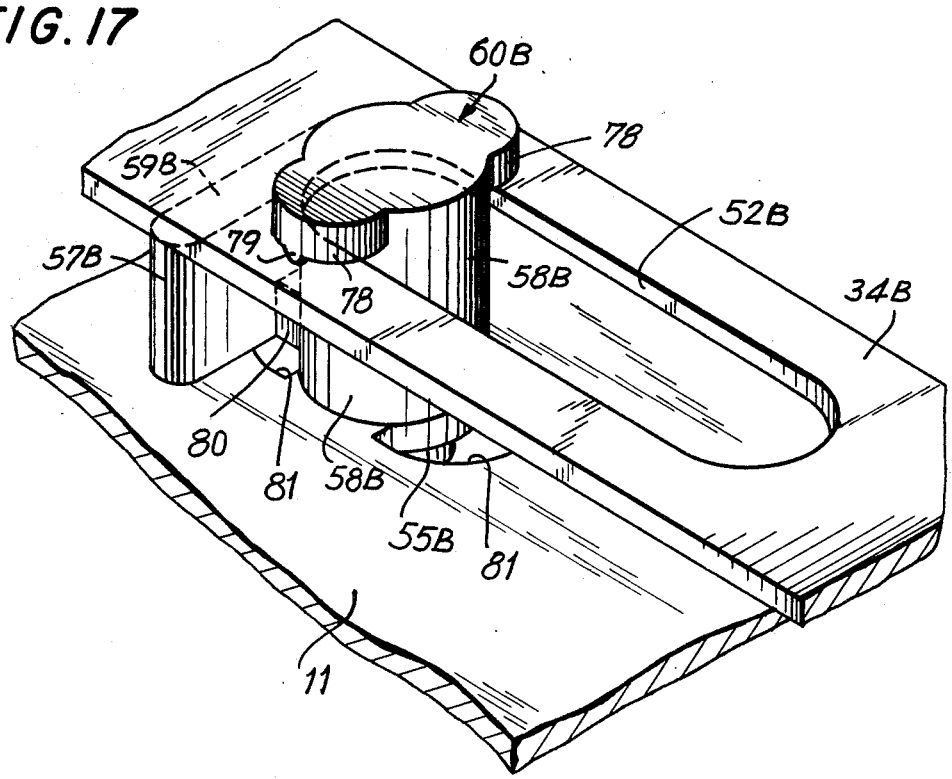
FIG. 17 is a perspective view similar to that of FIG. 14, but with the slide member being shown disposed on a bearing surface of the mounting member which is illustrated in its active position for preventing removal of the slide member from the base plate.

More particularly, it will be seen that mounting member 37B according to this invention is molded through a circular hole 53B in chassis 11 (FIG. 15) and includes a support portion 54B molded against the upper surface of chassis 11 at an area of the latter extending or radiating outwardly from hole 53B, a root portion 55B molded against the lower surface of the chassis at an area of the latter also extending or radiating outwardly from hole 53B, and a connecting portion 56B molded in circular hole 53B simultaneously with support and root portions 54B and 55B so as to be integral therewith and to have a circular cross-section for permitting turning of mounting member 37B relative to the chassis between an initial molded position shown on FIG. 14 and an active position angularly spaced by about 90° from the initial molded position, as shown on FIG. 17. In the illustrated mounting member 37B, support portion 54B includes a cylindrical post or pin 58B extending upwardly from chassis 11 and being diametrically dimensioned so as to be slidably received in a respective longitudinal slot 52B of a slide member 34B. Ears or extensions 78 project laterally in diametrically opposed directions from the upper end of cylindrical post 58B to define an oblong head 60B which, in the initial molded position of member 37B (FIG. 14) has its major axis aligned with the longitudinal axis of slide member 34B so as to be capable of passing through longitudinal slot 52B of the latter. Preferably, each of the lateral extensions or ears 78 is molded with a protrusion 79 of relatively small area projecting downwardly therefrom for a purpose hereinafter described in detail. The support portion 54B of mounting member 37B is further shown to include a bearing element 57B molded against the upper surface of chassis 11 to one side of the cylindrical post 58B and being integrally joined to the latter by a neck portion 80. The top of such bearing element 57B defines an elongated bearing surface 59B which is spaced downwardly from a horizontal plane passing through the lowermost portions of protrusions 79 by a distance substantially equal to the thickness of slide member 34B.

In order to permit the molding of mounting member 37B by one-piece dies 27B and 28B, chassis 11 is shown to be formed with generally semi-circular apertures 81 disposed at diametrically opposed locations adjacent circular hole 53B so as to be in alignment with the ears or projections 78 in the initial molded position of mounting member 37B. By reason of the apertures 81, extensions or projections 82 provided on the lower die 28B can extend upwardly through apertures 81 into the cavity of the upper die 27B for cooperation with the latter in forming parts of the surface of post 58B and the undersides of ears 78 of support portion 54B (FIG. 15). It will be apparent that, following the molding of mounting member 37B, dies 27B and 28B can be simply separated from the chassis 11 therebetween with the extensions 82 of die 28B being withdrawn through apertures 81 in the chassis.

Figure 19:
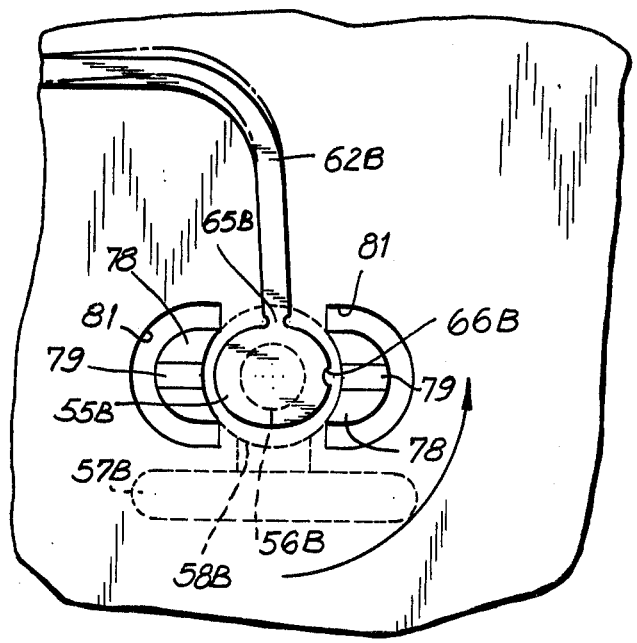
FIG. 19 is a bottom plan view of the mounting member shown on FIG. 14 for illustrating a locking means associated therewith.
Figure 18:
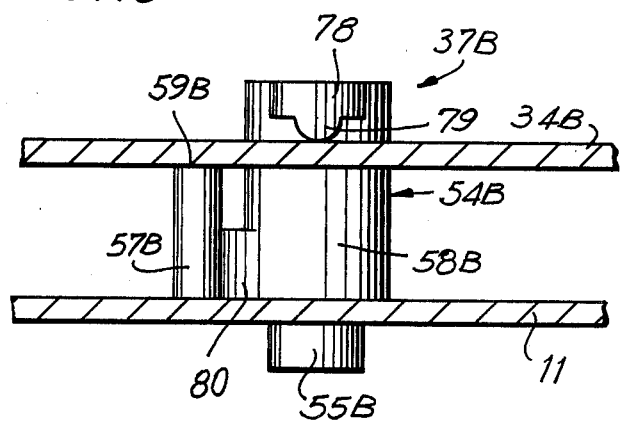
FIG. 18 is a side elevational view of the structure appearing on FIG. 17.

As shown particularly on FIG. 19, mounting member 37B according to this invention is preferably also provided with a locking means similar to that described above in connection with the mounting member 37, and of which only the elongated locking element 62B connected at a narrowed end portion 65B to the elliptical periphery of root portion 55B is shown on the drawing.

In employing mounting member 37B for mounting slide member 34B on chassis 11, slide member 34B is initially disposed on bearing surface 59B with member 37B in its initial molded position so that oblong head 60B therefore can pass upwardly through slot 52B (FIG. 14). Thereafter, mounting member 37B is turned through approximately 90° from its initial molded position to its active position shown on FIGS. 17 and 18. As a result of such turning of mounting member 37B, the ears 78 constituting oblong head 60B extend laterally in respect to slot 52B of the slide member so as to cause the protrusions 79 to bear downwardly on the upper surface of slide member 34B. Further, as a result of turning of mounting member 37B to its active position, bearing element 57B is made to extend laterally in respect to the longitudinal axis of slide member 34B so that elongated bearing surface 59B then slidably supports the slide member across at least a substantial portion of the width of the latter. By reason of the protrusions 79 engaging the upper surface of slide member 34B, upward removal of the latter from bearing surface 59B is prevented, while the frictional resistance to longitudinal movement of the slide member is minimized.

It will also be noted that, upon turning of mounting member 37B to its active position, the narrowed end portion 65B of locking element 62B is broken or separated from root portion 55B and, when mounting member 37B arrives at its active position, the free end of locking element 62B is securely engaged in recess 66B in the elliptical periphery of root portion 55B so as to secure mounting member 37B against turning in either direction from its active position.

Although illustrative embodiments of this invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A support assembly comprising
   a metal base plate having a circular hole therein; and
   a synthetic resin mounting member molded through said circular hole and including a support portion molded against one surface of said base plate at an area of the latter extending outwardly from said hole, a root portion molded against the opposite surface of said base plate at an area of the latter also extending outwardly from said hole, so as to permanently join the mounting member to the base plate, and a connecting portion molded in said circular hole simultaneously with said support and root portions so as to be integral therewith and to have a circular cross-section for permitting turning of said mounting member relative to said metal base plate about the axis of said connecting portion between an initial molded position and an active position angularly spaced from said initial position and at which said support portion is operative to mount a respective part on said base plate.

2. A support assembly according to claim 1; in which said circular hole of the base plate is spaced from the perimeter of said base plate, and said support and root portions of the synthetic resin mounting member are fully located within said perimeter of the base plate at least in said initial molded position of said member.

3. A support assembly according to claim 2; in which said support portion of the synthetic resin mounting member is dimensioned to project substantially beyond said perimeter of the base plate when said mounting member is turned from said initial molded position to said active position for mounting the respective part on said base plate.

4. A support assembly according to claim 1; in which said support portion of the synthetic resin mounting member has a body with a relatively enlarged head which is spaced from said base plate, and said base plate has at least one aperture therein adjacent said hole for permitting a respective portion of a die to extend through each said aperture from said opposite surface of the base plate and to cooperate with a die disposed against said one surface of the base plate in molding said support portion of the synthetic resin mounting member.

5. A support assembly comprising
a metal base plate having a circular hole therein;
a synthetic resin mounting member molded through said circular hole and including a support portion molded against one surface of said base plate at an area of the latter extending outwardly from said hole, a root portion molded against the opposite surface of said base plate at an area of the latter also extending outwardly from said hole so as to permanently join the mounting member to the base plate, and a connecting portion molded in said circular hole simultaneously with said support and root portions so as to be integral therewith and to have a circular cross-section for permitting turning of said synthetic resin mounting member relative to said metal base plate about the axis of said connecting portion between an initial molded position and an active position angularly spaced from said initial position and at which said support portion is operative to mount a respective part on said base plate; and
locking means molded integrally with said synthetic resin mounting member and being operative upon turning of the latter to said active position for securing said mounting member against turning from said active position in the directions toward and away from said initial molded position.

6. A support assembly according to claim 5; in which said metal base plate further has a pair of apertures therein spaced from each other and being equally spaced from said circular hole; and said locking means includes an arm portion extending radially from one of said support and root portions and being molded integrally therewith against the respective surface of said base plate over one of said apertures so as to have a projection molded in said one aperture, said arm portion being resiliently flexible away from said base plate for removing said projection from said one aperture during turning of said synthetic resin mounting member from said initial molded position to said active position, and said projection of the arm being received in the other of said apertures for said securing of the mounting member in said active position.

7. A support assembly comprising
a metal base plate having a circular hole therein and another hole in said metal base plate spaced from the first mentioned hole;
a synthetic resin mounting member molded through said circular hole and including a support portion molded against one surface of said base plate at an area of the latter extending outwardly from said hole, a root portion molded against the opposite surface of said base plate at an area of the latter also extending outwardly from said hole, and a connecting portion molded in said circular hole simultaneously with said support and root portions so as to be integral therewith and to have a circular cross-section for permitting turning of said synthetic resin mounting member relative to said metal base plate about the axis of said connecting portion between an initial molded position and an active position angularly spaced from said initial position and at which said support position is operative to mount a respective part on said base plate; and
locking means molded integrally with said synthetic resin mounting member and being operative upon turning of the latter to said active position for securing said mounting member against turning from said active position in the directions toward and away from said initial molded position, said locking means including a synthetic resin elongated locking element molded against said opposite surface of the base plate and being integrally joined, at one end, to an anchoring portion molded through said other hole, the other end of said elongated locking element being integrally joined to the periphery of said root portion of the mounting member, in said initial molded position of said mounting member, by a narrowed end portion which is frangible in response to turning of said mounting member from said initial molded position; said root portion of the mounting member having a recess located in said periphery thereof so as to receive said other end of the elongated locking element upon turning of said mounting member to said active position.

8. A support assembly according to claim 7; in which said elongated locking element has angularly related arms extending from said anchoring portion and said root portion, respectively, said other hole is non-circular so as to prevent turning of said anchoring portion therein, and said root portion of the mounting member is non-circular to provide a radial distance from the axis of said connecting portion to said recess that is substantially greater than the radial distance from said axis to the location on said periphery of the root portion at which said narrowed end portion of the locking element is joined to said root portion in said initial molded position of the mounting member.

9. A support assembly according to claim 7; in which said anchoring portion costitutes another synthetic resin mounting member molded simultaneously with the first mentioned mounting member and also including a support portion molded against said one surface of the base plate for mounting a respective part thereon, a root portion molded against said opposite surface of the base plate and a connecting portion molded in said other hole and being integral with said support and root portions of said other mounting member, and said elongated locking element is constituted by a runner connecting the root portions of said first and other mounting members, respectively, when the latter are simultaneously molded.

10. A support assembly according to claim 5; in which said circular hole of the base plate is spaced from the perimeter of said base plate, and said support and root portions of the synthetic resin mounting member are fully located within said perimeter of the base plate at least in said initial molded position of said member.

11. A support assembly according to claim 10; in which said support portion of the synthetic resin mounting member is dimensioned to project substantially beyond said perimeter of the base plate when said mounting member is turned from said initial molded position to said active position for mounting the respective part on said base plate.

12. A support assembly according to claim 5; in which said support portion of the synthetic resin mounting member has a body with a relatively enlarged head which is spaced from said base plate, and said base plate has apertures therein adjacent said hole for permitting portions of a die to extend through said apertures from said opposite surface of the base plate and to cooperate with a die disposed against said one surface of the base plate in molding said support portion of the synthetic resin mounting member.

13. The combination of a metal base plate having a circular hole therein; a part to be mounted on said base plate; and a synthetic resin mounting member molded through said circular hole and including a support portion molded against one surface of said base plate at an area of the latter extending outwardly from said hole, a root portion molded against the opposite surface of said base plate at an area of the latter also extending outwardly from said hole so as to permanently join the mounting member to the base plate, and a connecting portion molded in said circular hole simultaneously with said support and root portions so as to be integral therewith and to have a circular cross-section for permitting turning of said mounting member relative to said metal base plate about the axis of said connecting portion between an initial molded position and an active position angularly spaced from said initial position and at which said support portion is operative to mount said part on said base plate.

14. The combination according to claim 13; in which said circular hole of the base plate is spaced from the perimeter of said base plate, and said support and root portions of the synthetic resin mounting member are fully located within said perimeter of the base plate at least in said initial molded position of said mounting member.

15. The combination according to claim 14; in which said support portion of the synthetic resin mounting member is dimensioned to project substantially beyond said perimeter of the base plate when said mounting member is turned from said initial molded position to said active position for mounting said part on said base plate with at least a portion of said part extending beyond said perimeter.

16. The combination according to claim 13; in which said support portion of the mounting member has a body with a laterally enlarged head extending therefrom and being spaced from said base plate, said laterally enlarged head of the support portion extends over said part in said active position of the mounting member for holding said part against movement away from said base plate, and said base plate has at least one aperture therein adjacent said hole for permitting a respective portion of a die to extend through each said aperture from said opposite surface of the base plate and to cooperate with a die disposed against said one surface of the base plate in molding said support portion of the synthetic resin mounting member.

17. The combination according to claim 13; further comprising locking means molded integrally with said synthetic resin mounting member and being operative upon turning of the latter to said active position for securing said mounting member against turning from said active position in the directions toward and away from said initial molded position.

18. The combination according to claim 17; in which said metal base plate further has a pair of apertures therein spaced from each other and being equally spaced from said circular hole; and said locking means includes an arm portion extending radially from one of said support and root portions and being molded integrally therewith against the respective surface of said base plate over one of said apertures so as to have a projection molded in said one aperture, said arm portion being resiliently flexible away from said base plate for removing said projection from said one aperture during turning of said synthetic resin mounting member from said initial molded position to said active position, and said projection of the arm being received in the other of said apertures for said securing of the mounting member in said active position.

19. The combination of a metal base plate having a circular hole therein and another hole in said base plate spaced from the first mentioned hole; a part to be mounted on said base plate; a synthetic resin mounting member molded through said circular hole and including a support portion molded against one surface of said base plate at an area of the latter extending outwardly from said hole, a root portion molded against the opposite surface of said base plate at an area of the latter also extending outwardly from said hole, and a connecting portion molded in said circular hole simultaneously with said support and root portions so as to be integral therewith and to have a circular cross-section for permitting turning of said mounting member relative to said metal base plate about the axis of said connecting portion between an initial molded position and an active position angularly spaced from said initial position and at which said support portion is operative to mount said part on said base plate; and locking means molded integrally with said synthetic resin mounting member and being operative upon turning of the latter to said active position for securing said mounting member against turning from said active position in the directions toward and away from said initial molded position, said locking means including a synthetic resin elongated locking element molded against said opposite surface of the base plate and being integrally joined, at one end, to an anchoring portion molded through said other hole, the other end of said elongated locking element being integrally joined to the periphery of said root portion of the mounting member, in said initial molded position of said mounting member, by a narrowed end portion which is frangible in response to turning of said mounting member from said initial molded position; and said root portion of the mounting member having a recess located in said periphery thereof so as to receive said other end of the elongated locking element upon turning of said mounting member to said active position.

20. The combination according to claim 19; in which said elongated locking element has angularly related arms extending from said anchoring portion and said root portion, respectively, said other hole is non-circular so as to prevent turning of said anchoring portion therein, and said root portion of the mounting member is non-circular to provide a radial distance from the axis of said connecting portion to said recess that is substantially greater than the radial distance from said axis to the location on said periphery of the root portion at which said narrowed end portion of the locking element is joined to said root portion in said initial molded position of the mounting member.

21. The combination according to claim 19; in which said anchoring portion constitutes another synthetic resin mounting member molded simultaneously with the first mentioned mounting member and also including a support portion molded against said one surface of the base plate for mounting a respective part thereon, a root portion molded against said opposite surface of the base plate and a connecting portion molded in said other hole and being integral with said support and root portions of said other mounting member, and said elongated locking element is constituted by a runner connecting the root portions of said first and other mounting member, respectively, when the latter are simultaneously molded.

22. The combination according to claim 13; in which said support portion of the molding member has a body with at least one lateral extension projecting therefrom and being angularly related to said body to permit movement of said part toward and away from said base plate with said support member in said initial molded position and to engage over said part for holding the latter against movement away from said base plate with said support member in said active position.

23. The combination of a metal base plate having a circular hole therein; a part to be mounted on said base plate and being in the form of an elongated slide member having a longitudinal slot therein; and a synthetic resin mounting member molded through said circular hole and including a support portion molded against one surface of said base plate at an area of the latter extending outwardly from said hole, a root portion molded against the opposite surface of said base plate at an area of the latter also extending outwardly from said hole, and a connecting portion molded in said circular hole simultaneously with said support and root portions so as to be integral therewith and to have a circular cross-section for permitting turning of said mounting member relative to said metal base plate about the axis of said connecting portion between an initial molded position and an active position angularly spaced from said initial position and at which said support portion is operative to mount said part on said base plate; said support portion of the mounting member having a body with at least one lateral extension projecting therefrom and being angularly related to said body to permit movement of said part toward and away from said base plate with said support member in said initial molded position and to engage over said part for holding the latter against movement away from said base plate with said support member in said active position, and a bearing surface on said body facing away from said base plate for slidably supporting said slide member, each said lateral extension being aligned with said longitudinal slot in said initial molded position so as to pass through said slot when said slide member is brought into engagement with said bearing surface, and each said lateral extension extending transversely to said longitudinal slot for engaging over said slide member and holding the latter against said bearing surface when said mounting member is turned to said active position.

24. The combination according to claim 23; in which said body of the support portion has a laterally opening undercut below each said lateral extension for defining said bearing surface.

25. The combination according to claim 23; in which each said lateral extension of the support portion has a protrusion of small area projecting therefrom toward said base plate for engagement with said slide member in said active position so as to minimize frictional resistance to longitudinal movement of said slide member.

26. The combination according to claim 23; in which said body of the support portion has a bearing element extending therefrom substantially at right angles to said lateral extension for defining said bearing surface.

27. The combination according to claim 22; in which said lateral extension is in the form of an elongated arm which is spaced from said base plate for a portion of its length and has its free end portion molded against said one surface of the base plate, and said arm is resiliently flexible in the direction away from said base plate so that, during turning of said mounting from said initial molded position to said active position, said arm can be flexed away from said base plate for movement of said free end portion over said part.

* * * * *